United States Patent [19]
Pidutti et al.

[11] Patent Number: 6,166,869
[45] Date of Patent: Dec. 26, 2000

[54] METHOD AND CIRCUIT FOR ENABLING RAPID FLUX REVERSAL IN THE COIL OF A WRITE HEAD ASSOCIATED WITH A COMPUTER DISK DRIVE, OR THE LIKE

[75] Inventors: Albino Pidutti, Udine, Italy; Axel Alegre de La Soujeole, Scotts Valley; Elango Pakriswamy, Santa Clara, both of Calif.

[73] Assignee: STMicroelectronics, Inc., Carrollton, Tex.

[21] Appl. No.: 08/928,999

[22] Filed: Sep. 12, 1997

Related U.S. Application Data

[63] Continuation-in-part of application No. 08/884,993, Jun. 30, 1997, Pat. No. 6,124,751.

[51] Int. Cl.$^7$ ..................................................... G11B 5/09
[52] U.S. Cl. ............................................................ 360/46
[58] Field of Search ................................... 360/46, 67, 68

[56] References Cited

U.S. PATENT DOCUMENTS

| | | | |
|---|---|---|---|
| 4,454,454 | 6/1984 | Valentine | 318/293 |
| 4,535,203 | 8/1985 | Jenkins et al. | 179/81 R |
| 5,221,881 | 6/1993 | Cameron | 318/254 |
| 5,285,135 | 2/1994 | Carobolante et al. | 318/254 |
| 5,297,024 | 3/1994 | Carobolante | 360/67 |
| 5,332,954 | 7/1994 | Lankin | 318/139 |
| 5,566,369 | 10/1996 | Carobolante | 360/75 |
| 5,642,065 | 6/1997 | Choi et al. | 327/110 |
| 5,712,536 | 1/1998 | Haas et al. | 315/247 |
| 5,757,215 | 5/1998 | Schuelke et al. | 360/46 |
| 5,841,603 | 11/1998 | Ramalho et al. | 360/68 |
| 5,867,334 | 2/1999 | Soichi et al. | 360/46 |
| 5,869,988 | 2/1999 | Jusuf et al. | 360/46 |

OTHER PUBLICATIONS

Pedrazzini, "IBM's Hard Disk Drive Load/Unload Technology," *Computer Data Storage Newsletter*, Jul. 1997, vol. 10(7), Issue No. 114, p. 12.

Irwin, "Maximum Average Power Transfer," *Basic Engineering Circuit Analysis*, 3d ed., pp. 453–454. (Date Not Available).

*Primary Examiner*—W. Chris Kim
*Attorney, Agent, or Firm*—David V. Carlson; Theodore E. Galanthay; Lisa K. Jorgenson

[57] ABSTRACT

An H-bridge for applying a current to a coil of a write head assembly for writing data to a magnetic media includes two pair of two switchable transistors. Each pair of transistors is connected between a supply voltage and a reference potential and is adapted to be connected to the coil between the transistors of each pair for turning the transistors turned on and off in a sequence to control the direction of current flow in the coil. The upper transistors of each pair serves a switching transistor, and the lower transistors provide a mirrored referenced current to the coil. A pair of capacitors are connected to a control element of a respective associated one of the lower transistors, and switching circuitry is connected to the capacitors to selectively connect each of the capacitors to inject current into the control element of the respective associated lower transistor when the respective associated lower transistor is turned on. Also disclosed is a technique for adjusting the amount of boost current injected into the lower transistors.

9 Claims, 3 Drawing Sheets

METHOD AND CIRCUIT FOR ENABLING RAPID FLUX REVERSAL IN THE COIL OF A WRITE HEAD ASSOCIATED WITH A COMPUTER DISK DRIVE, OR THE LIKE

CROSS REFERENCE TO RELATED APPLICATION

This application is a continuation-in-part of patent application Ser. No. 08/884,993, filed Jun. 30, 1997, now U.S. Pat. No. 6,124,751.

This application is also related to patent application, filed on even date herewith, application Ser. No. 08/928,447, filed Sep. 12, 1997, U.S. Pat. No. 6,052,017.

BACKGROUND OF THE INVENTION

1. Field of the Invention

This invention relates to improvements in methods and circuits for driving inductive loads, or the like, to which it is desired to apply signals having a fast rise time, and more particularly to improvements in methods and circuits for driving inductive loads of the type used in conjunction with a write head of a disk drives, or the like.

2. Relevant Background

Most computer systems include one or more associated disk drives, which may be built into the computer system, or which may be external to the computer system for connection via known means to the system. Typically, disk drives have at least one rotating magnetic medium and associated head mechanisms that are carried adjacent the material. The heads are radially positionable to selectively write information to, or read information from, precise positions on the disk medium. Such disk drives may be, for example, so-called hard disk drives, floppy drives, or the like.

Data is written to the associated data disk by applying a series of signals to the write head according to the digital information to be stored on the magnetic disk media. The write head has a coil and one or more associated pole pieces that are located in proximity to the disk media. As the magnetic flux changes in the head, the magnetic domains of the magnetic media of the disk are aligned in predetermined directions for subsequent read operations. Typically, a small space separates each magnetic domain transition to enable successive transitions on the magnetic media to be distinguished from each other.

Since the disk is moving relative to the head, it can be seen that if the small space separating the magnetic domain transitions is not sufficiently wide, difficulty may be encountered in distinguishing successive magnetic transitions. This may result in errors in reading the data contained on the disk, which is, of course, undesirable.

Meanwhile, as computers are becoming faster and faster, it is becoming increasingly important to increase the speed at which data can be written to the disk media. However, since the data signals are in the form of square wave transitions, if the rise time of the leading edges of the square waves is large, the small space between magnetic media transitions also becomes large, which reduces the effective rate at which data can be accurately written and read. Since the write head assembly includes at least one coil, forcing the current to rise rapidly, or to reverse flux directions, within the write head is difficult.

In the past, data writing circuits used to supply such write signals to the heads include preamplifier circuits to drive the current through selected legs of an "H-bridge" circuit, which is capable of allowing relatively fast current reversals for accurate data reproduction.

An example of a typical H-bridge write head data driving circuit 10, according to the prior art, is shown in FIG. 1. The circuit 10 includes four MOS transistors, 12–15 connected between a $V_{CC}$ rail 11 and ground 17. A coil 19, used, for example, to supply data pulses for writing to a disk drive media is integrated into the write head mechanism. It is connected between the center legs of the H-bridge, as shown.

It can be seen that, depending on the gate biases applied to the respective transistors 12–15, the current flows through the coil 19 in one direction or another. That is, one current flow path includes the transistor 14, coil 19 from right to left, and transistor 13. The other current flow path includes transistor 12, the coil 19 from left to right, and the transistor 15.

In the H-bridge circuit 10, the transistors 12 and 14 serve as switching transistors, which are controlled by the out-of-phase signals on the respective input lines 28 and 29. The transistors 13 and 15 serve as current control transistors, which are controlled by the out-of-phase signals on the respective input lines 29 and 28 in a manner opposite from the connections to the switching transistors 12 and 14, via respective control transistors 31 and 32. The magnitude of the current through the transistors 13 and 15 is controlled by transistor 21, with which the transistors 13 and 15 form respective current mirrors, when connected via respective transmission gates 24 and 25. The transmission gates 24 and 25 are controlled by the signals on the respective input lines 29 and 28, in the same manner as the associated transistors 31 and 32. A reference current source 26 supplies the reference current to transistor 21, which is mirrored by currents in respective transistors 13 and 15, as described above.

Thus, the data drive signals supplied to the head mechanism associated with the circuit 10 may be controlled by applying appropriate signals to the input lines 28 and 29. However, as mentioned, as data rates increase, the rates at which the heads can accurately write the data to the magnetic media is limited by the speed at which the flux in the coil 19 (and its associated components) can be reversed. The maximum data rate is thus limited to the maximum physical flux reversal rate of the driver circuitry.

It can be seen that in addition to the problem of reversing the flux in the coil 19 due to the inductive reactance of the coil, the time that is required to charge the gates of transistors 13 and 15 before they can conduct the proper current also results in a delay in reversing the flux in the coil 19. A waveform of a typical $V_{GS}$ seen at the gates and sources of transistors 13 and 15 is denoted by reference numeral 27. It can be seen that the waveform 27 has a significant rise time, due to the factors described above.

What is needed, therefore, is a method and circuit for driving an inductive load of the type used in conjunction with a write head of a disk drive for association with a computer or the like, with a signal that enables a maximum flux reversal rate in the driver coil.

SUMMARY OF THE INVENTION

In light of the above, therefore, is an object of the invention to provide a method and circuit for driving an inductive load.

It is another object of the invention to provide a method and circuit of the type described for driving an inductive load of the type used in conjunction with a write head of a disk drive for association with a computer or the like.

It is another object of the invention to provide a method and circuit of the type described for driving an inductive load of the type used in conjunction with a write head of a disk drive for association with a computer or the like with a signal that enables a maximum flux reversal rate in the driver coil.

It is another object of the invention to provide a method and circuit of the type described for driving an inductive load of the type described with a signal having a fast rise time.

It is another object of the invention to provide a method and circuit of the type described for driving an inductive load of the type described that enables data to be written faster, with more accurate data transitions on the recording media than with typical H-bridge drivers.

These and other objects, features and advantages of the invention will be apparent to those skilled in the art from the following detailed description of the invention, when read in conjunction with the accompanying drawings and appended claims.

The object of the invention is addressed by an H-bridge circuit for applying a current to a coil of a write head assembly for writing data to a magnetic media. The H-bridge includes two pair of two switchable transistors. Each pair of transistors is connected between a supply voltage and a reference potential and is adapted to be connected to the coil between the transistors of each pair for turning the transistors turned on and off in a sequence to control the direction of current flow in the coil. The upper transistors of each pair serves a switching transistor, and the lower transistors provide a mirrored referenced current to the coil. A pair of capacitors are connected to a control element of a respective associated one of the lower transistors, and switching circuitry is connected to the capacitors to selectively connect each of the capacitors to inject current into the control element of the respective associated lower transistor when the respective associated lower transistor is turned on.

According to another aspect of the invention, a method is presented for adjusting a rise time of a current to a coil associated with a write head for writing data to a magnetic media. The method includes the steps of mirroring a reference current in current control transistors of said H-bridge and providing a pair of boost capacitors to inject a current into control elements of respective ones of said current control transistors. The method may also include matching said boost capacitors to provide a capacitance substantially equal to a capacitance of said respective ones of said current control transistors. The boost capacitors may be matched by making them substantially similar to the control transistors with which they are associated.

BRIEF DESCRIPTION OF THE DRAWINGS

The invention is shown in the accompanying drawings in which.

In the various figures of the drawing, like reference numerals are used to denote like or similar parts.

DETAILED DESCRIPTION OF THE PREFERRED EMBODIMENTS

Figure 1:
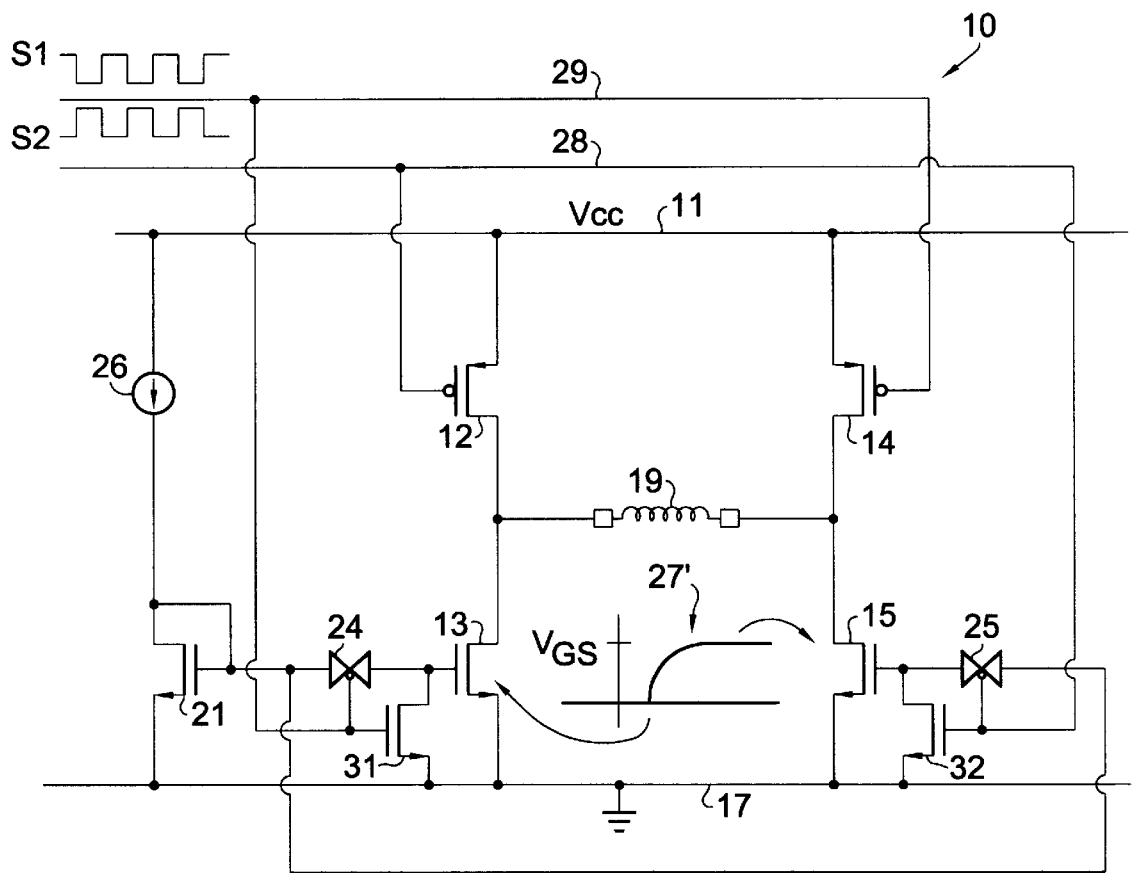
FIG. 1 is an electrical schematic diagram of an H-bridge circuit for driving a coil of the type used in magnetic write heads, or the like, in accordance with the prior art.
Figure 2:
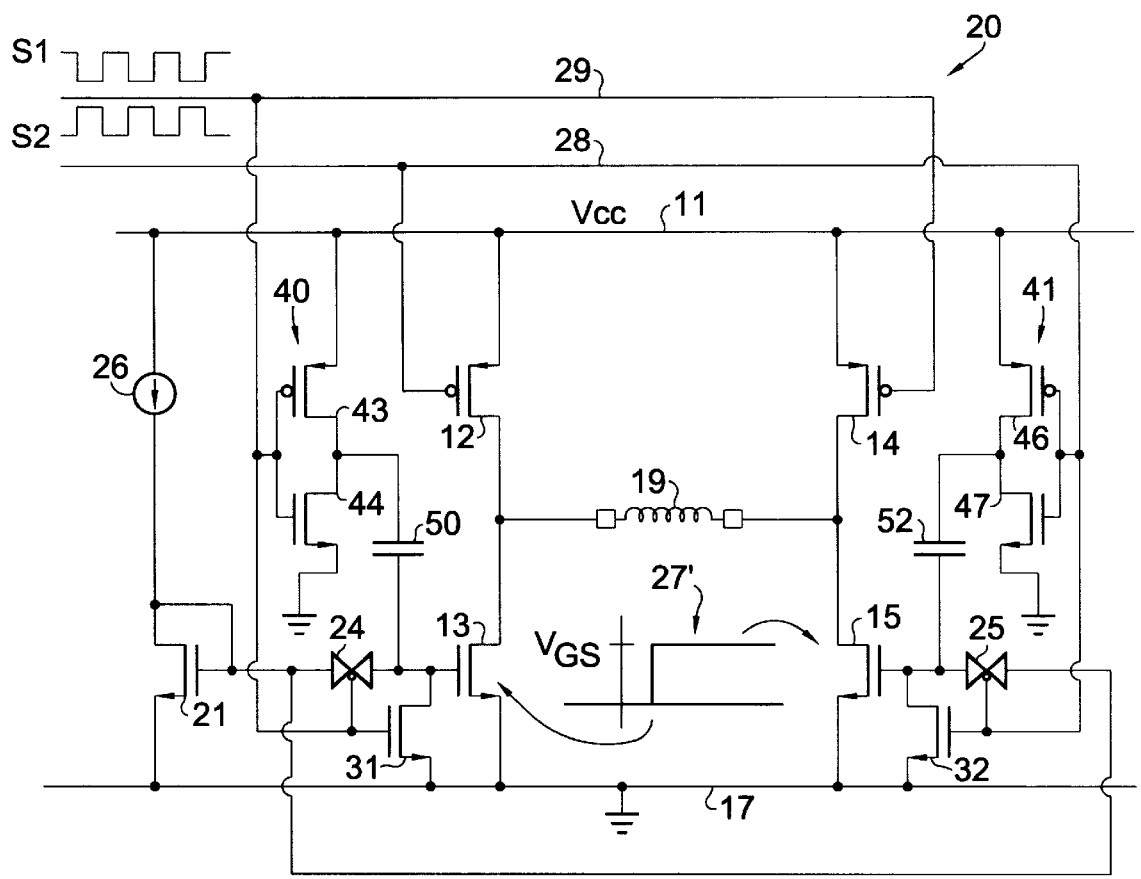
FIG. 2 is an electrical schematic diagram of an H-bridge circuit for driving a coil of the type used in magnetic write heads, or the like, in accordance with the present invention.

With reference now to FIG. 2, an electrical schematic diagram of an H-bridge coil driving circuit 20, according to the invention is shown. The H-bridge circuit 20 of FIG. 2 is similar to the H-bridge circuit 10 of FIG. 1, except for the addition of boost capacitor circuits 40 and 41. The components in FIG. 2 are otherwise numbered similarly with like components in FIG. 1, and are not described further herein.

The boost circuits 40 and 41 each include inverters, each formed of a pair of transistors 43–44 and 46–47, respectively, connected between the $V_{CC}$ rail 11 and reference potential or ground 17. The gates of the transistors 43–44 and 46–47 are respectively connected to the signal input lines 29 and 28. The drains of the transistors 43 and 44 are connected by a boost capacitor 50 to the gate of transistor 13, and, similarly, the drains of the transistors 46 and 47 are connected by a boost capacitor 52 to the gate of transistor 15.

The values of the boost capacitors 50 and 52 are selected to match, or to be substantially the same as, the gate-source capacitance of the transistors 13 and 15. Thus, for example, the value of boost capacitor 50 may be determined by the following formula:

$$C_{50} = C_{GS13} \frac{V_{GS21}}{V_{CC} - V_{GS21}}$$

Where $C_{50}$ is the capacitance of the added boost capacitor 50;

$C_{GS13}$ is the input capacitance of the transistor 13;

$V_{GS21}$ is the $V_{GS}$ of transistor 21 through which the reference current $I_{REF}$ from the current source 26 flows; and $V_{CC}$ is the supply voltage.

The same considerations apply to the determination of the capacitance of capacitor 52 at the gate of transistor 15. The above considerations result in the selection of compensating capacitors 50 and 52 that provide for a square waveform, $V_{GS}$, at the inputs to transistors 13 and 15 in response to a square input signal, as shown by the curve 27' in the circuit drawing of FIG. 2.

In operation, as the transistors 13 and 15 are switched, and, for example, transistors 13 and 14 are brought into conduction, the upper side of the capacitor 50 is brought from ground to $V_{CC}$ by MOS transistor 43. During this phase, current is injected into the gate of the MOS transistor 13. If the current injected into the gate of transistor 13 brings the gate to the same voltage value as the voltage on the gate of transistor 21, no current will flow through the transmission gate 24. It can be seen that the lower the internal resistance of transistor 43, the faster the gate of transistor 13 will charge.

On the other side of the circuit, when transistor 15 is turned off, transistor 47 will be turned on, connecting the top plate of the capacitor 52 to ground. Since transistor 32 also is in conduction when transistor 15 is off, the bottom plate of the capacitor 52 also is connected to ground. Thus, the capacitor is fully discharged between cycles.

It will be appreciated that the value of the boost capacitance in this embodiment will desirably be the same as the gate capacitance of the switch transistor with which the boost capacitor is associated. Thus, in the fabrication of the H-bridge circuit in an integrated circuit embodiment, the boost capacitors may be constructed in as part of the same process flow as their associated switch transistors. That is, the boost capacitors may be constructed in the same manner as an MOS device, with the gate serving as one side of the capacitor and the polysilicon substrate serving as the other side. If the physical layout of the capacitor structures is made the same as that of the associated switched transistors, border and other effects may also be matched.

If more or less boost voltage is desired, it can be modified by varying the $V_{GS}$ of transistor 13. The change of $V_{GS}$ necessary ($\Delta V_{GS}$) is given by the following formula $$\Delta V_{GS} = \frac{V_{CC}C_{50} - V_{GS21}(C_{GS13} + C_{50})}{C_{GS13} + C_{50} + C_{GS21}}$$

Figure 3:
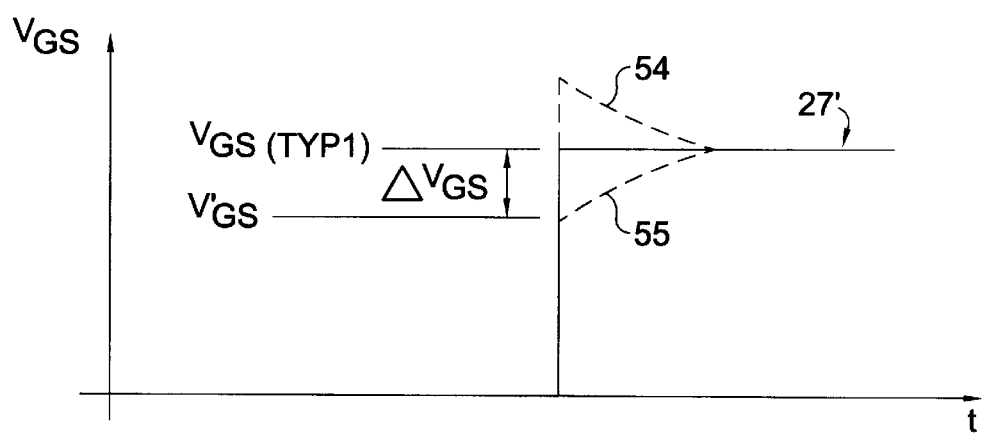
FIG. 3 is a graph of a showing compensated, undercompensated, and overcompensated voltage waveforms developed at the gates of the switching transistors in the circuit of FIG. 2.
Figure 4:
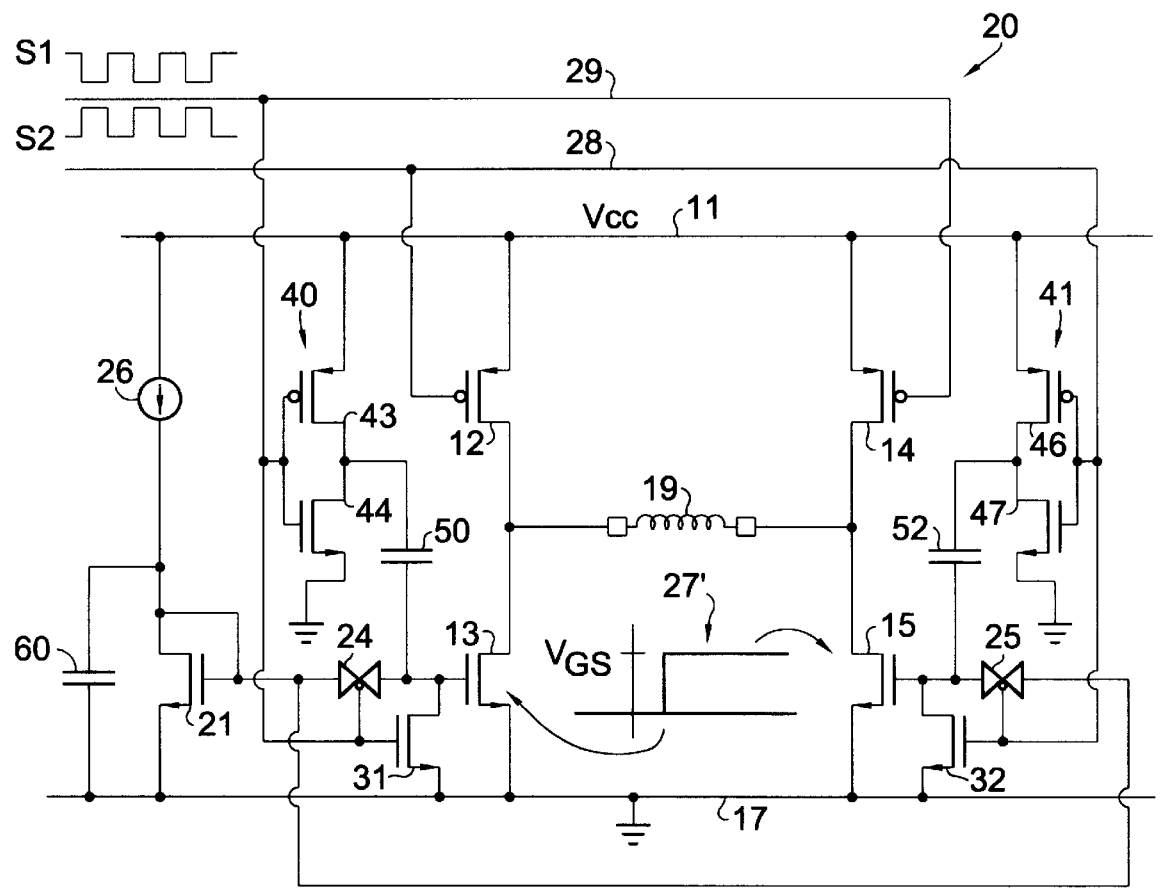
FIG. 4 is an electrical schematic diagram of a modified H-bridge circuit for driving a coil of the type used in magnetic write heads, or the like, in accordance with the present invention.

Thus, as shown in FIG. 3, a curve 54 providing greater boost than the typical $V_{GS}$ curve 27', or a curve 55 providing less boost than the typical $V_{GS}$ curve 27', can be designed by selectively varying $V_{GS21}$. To reduce the transients on the transistor 21 a capacitor 60 can be connected in parallel with transistor 21, as shown in FIG. 4. The capacitor 60 eliminates delays associated with recharging the transistor 21 due to the switching transitions of the signals S1 and S2 on lines 29 and 28.

In some working environments, the working conditions may vary. Thus, in those cases, it may be desirable to provide a programmable capacitors 50, 52 to enable the circuit to be optimized regardless of the particular working environment. Particularly in the case where the capacitor is formed as a part of the same integrated circuit process flow as that in which the MOS transistors of the circuit are formed, the capacitor may be physically constructed with plural extensions that may be selectively connected to vary the total capacitance of the capacitor. Alternatively, in many cases, the current of the reference current generator 26 may be programmable by externally supplied signals. It would be easy to use the same program signals to program a desired value for the capacitors 50, 52.

As noted above, the value of the boost capacitor depends also upon the value of $V_{CC}$. Thus, the value of VCC may be monitored to control the value of the boost capacitor.

Still another possible modification to the circuit is to monitor both the $V_{CC}$ and the $V_{GS21}$. Thus, temperature effects and the spread of the MOS threshold voltage can be compensated my monitoring $V_{CC}$ and the $V_{GS21}$. The results of such monitoring may be used, for example, to vary the value of the reference current from the reference current generator 26.

It can be seen from the foregoing that the circuit 20 provides for driving an inductive load with a signal having a fast rise time, enabling selectively adjustable exact, under-, and over-compensated current injection into the control elements of the mirror transistors 13 and 15. Thus, the circuit 20 enables data to be written faster, with more accurate data transitions on the recording media than with typical H-bridge drivers.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An H-bridge circuit including first and second pairs of switching devices to selectively couple an inductive electrical load between first and second voltage supply lines, said H-bridge circuit comprising:

a boost capacitor coupled between the first voltage supply line and a switching terminal of each of said second pair of switching devices, said boost capacitor having a capacitance substantially equivalent to an input capacitance of an associated one of said second pair of switching devices;

an additional switching device having a control terminal and first and second current carrying terminals thereof, said control terminal being coupled to said first current carrying terminal;

a current source coupled in series with said first and second current carrying terminals of said additional switching device between said first and second voltage supply lines; and an electrical connection between the control terminal of the additional switching device and the switching terminal of the associated one of said second pair of switching devices.

2. The H-bridge circuit of claim 1 wherein said switching devices comprise MOS transistors.

3. The H-bridge circuit of claim 1 wherein said second pair of switching devices comprises N-channel MOS transistors.

4. The H-bridge circuit of claim 1 wherein said boost capacitor comprises an MOS capacitor.

5. The H-bridge circuit of claim 1 wherein said boost capacitor and said associated one of said second pair of switching devices have a substantially similar physical layout.

6. The H-bridge circuit of claim 1 wherein said physical dimensions of said boost capacitor and said associated one of said second pair of switching devices are substantially identical.

7. The H-bridge circuit of claim 1 wherein said input capacitance of said associated one of said second pair of switching devices is substantially equal to its gate capacitance.

8. The H-bridge circuit of claim 1 further comprising an additional capacitor coupled across said first and second current carrying terminals of said additional switching device.

9. The H-bridge circuit of claim 8 wherein said additional capacitor is effective to reduce the control terminal-to-second current carrying terminal capacitance of said additional switching device.

* * * * *